(12) United States Patent
Park

(10) Patent No.: US 9,378,819 B2
(45) Date of Patent: Jun. 28, 2016

(54) ELECTRONIC DEVICE AND METHOD FOR OPERATING THE SAME

(71) Applicant: SK hynix Inc., Icheon-Si (KR)

(72) Inventor: Yeon-Hee Park, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 162 days.

(21) Appl. No.: 14/191,422

(22) Filed: Feb. 27, 2014

(65) Prior Publication Data

US 2014/0241042 A1    Aug. 28, 2014

(30) Foreign Application Priority Data

Feb. 28, 2013  (KR) .................. 10-2013-0022201

(51) Int. Cl.
*G11C 13/00* (2006.01)
*G11C 29/02* (2006.01)

(52) U.S. Cl.
CPC ........ *G11C 13/0069* (2013.01); *G11C 13/0004* (2013.01); *G11C 13/0007* (2013.01); *G11C 29/021* (2013.01); *G11C 29/028* (2013.01); *G11C 13/004* (2013.01); *G11C 2013/0073* (2013.01); *G11C 2213/79* (2013.01)

(58) Field of Classification Search
CPC ................. G11C 13/0002; G11C 13/0069
USPC ........................................... 365/148
See application file for complete search history.

(56) References Cited

U.S. PATENT DOCUMENTS

| 8,107,280 B2 | 1/2012 | Yoon et al. | |
| 2008/0225603 A1* | 9/2008 | Hein | G11C 7/1051 365/189.05 |
| 2010/0082898 A1* | 4/2010 | Mangold | G06F 12/02 711/113 |
| 2011/0289388 A1* | 11/2011 | Nelson | G11C 11/5642 714/773 |
| 2011/0317482 A1* | 12/2011 | Pyeon | G11C 8/08 365/163 |

FOREIGN PATENT DOCUMENTS

KR    10-0996193 B1    11/2010

* cited by examiner

*Primary Examiner* — Hoai V Ho
*Assistant Examiner* — Tri Hoang
(74) *Attorney, Agent, or Firm* — Perkins Coie LLP

(57) ABSTRACT

An electronic device including a semiconductor memory. The semiconductor memory includes a cell array divided into at least two regions each of which includes a plurality of memory cells each including a transistor and a resistance variable element; a write driver circuit configured to supply write current to a memory cell selected among memory cells in the cell array; and a back bias voltage supply unit configured to supply back bias voltages with different levels to the regions in the cell array.

19 Claims, 6 Drawing Sheets

ELECTRONIC DEVICE AND METHOD FOR OPERATING THE SAME

CROSS-REFERENCE TO RELATED APPLICATIONS

The present application claims priority of Korean Patent Application No. 10-2013-0022201, entitled "SEMICONDUCTOR DEVICE AND, PROCESSOR AND SYSTEM INCLUDING THE SAME," and filed on Feb. 28, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic that switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device. An electronic device is provided which is capable of constantly retaining current flowing through resistance variable elements in a write operation for recording data in the resistance variable elements.

In one aspect, an electronic device is provided to include a semiconductor memory that includes: a cell array divided into at least two regions each of which includes a plurality of memory cells each including a transistor and a resistance variable element; a write driver circuit configured to supply write current to a memory cell selected among memory cells in the cell array; and a back bias voltage supply unit configured to supply back bias voltages with different levels to the regions in the cell array.

In some implementations, the levels of the back bias voltages to be supplied to the regions may be determined according to distances between the write driver circuit and the regions.

In some implementations, a back bias voltage with a lower level may be supplied as a distance of a region from the write driver circuit increases.

In some implementations, the back bias voltages with different levels may be supplied to transistors in corresponding regions.

In some implementations, the resistance variable element may include a metal oxide or a phase change substance, and a tunnel barrier layer is interposed between two ferromagnetic layers.

In some implementations, the back bias voltage supply unit may include: a negative voltage pumping section configured to generate a negative voltage; and at least two trimming sections configured to trim the negative voltages to different levels, and supply the back bias voltages with different levels.

In another aspect, an electronic device is provided to include a semiconductor memory that includes: a bit line arranged in a first direction; a source line arranged parallel to the bit line; a plurality of memory cells each including a resistance variable element and a transistor which are coupled in series between the bit line and the source line; a plurality of word lines arranged in a second direction perpendicular to the first direction, and configured to control transistors of memory cells corresponding to them among the plurality of memory cells; a write driver circuit configured to supply write current between the bit line and the source line; and a back bias voltage supply unit configured to supply at least two back bias voltages with different levels to the plurality of memory cells such that a back bias voltage with a higher level is supplied to a memory cell as a distance of the memory cell from the write driver circuit decreases.

In some implementations, the write driver circuit may supply write current in a direction extending from the bit line to the source line or in a direction extending from the source line to the bit line, according to a logic level of data.

In some implementations, the resistance variable element may include a metal oxide or a phase change substance, and a tunnel barrier layer is interposed between two ferromagnetic layers.

In some implementations, the electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In another aspect, an electronic device is provided to include a semiconductor memory that includes: a cell array including different cell regions each of which includes a plurality of memory cells, each memory cell including a transistor and a resistance variable element; a write driver circuit coupled to the cell array to supply a write current for storing data in a memory cell selected among the plurality of memory cells; and a back bias voltage supply unit coupled to the different cell regions of the cell array and configured to supply back bias voltages with different levels to the respective regions.

In some implementations, the levels of the back bias voltages to be supplied to the respective regions may be determined based on distances between the write driver circuit and the respective cell regions.

In some implementations, a back bias voltage may decrease as a distance of a corresponding cell region from the write driver circuit increases.

In some implementations, the back bias voltage supply unit may supply the back bias voltages with different levels to transistors in the different cell regions.

In some implementations, the resistance variable element may include at least one of a metal oxide, a phase change substance.

In some implementations, the back bias voltage supply unit may comprise: a negative voltage pumping section configured to generate a negative voltage; and at least two trimming sections configured to trim the negative voltages to different levels and supply the back bias voltages with different levels.

In another aspect, an electronic device is provided to include a semiconductor memory that includes: a bit line and a source line arranged in a first direction; a plurality of memory cells each including a resistance variable element and a transistor which are coupled in series between the bit line and the source line; a plurality of word lines arranged in a second direction perpendicular to the first direction, and connected to the respective transistors of the plurality of memory cells to activate a corresponding transistor of a selected memory cell among the plurality of memory cells; a write driver circuit configured to supply write current to the selected memory cell; and a back bias voltage supply unit configured to supply back bias voltages with different levels to the plurality of memory cells such that a back bias voltage with a higher level is supplied to a memory cell that is apart by a greater distance from the write driver circuit.

In some implementations, the write driver circuit may supply write current in different directions to store data with different logic values in a resistance variable element of the selected memory cell.

In some implementations, the resistance variable element may include at least one of a metal oxide and a phase change substance.

In some implementations, the electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the resistance variable element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In yet another aspect, a method for operating an electronic device including a power supply device is provided. The method comprises: providing memory cells arranged between a source line and a bit line, each memory cell including a resistance variable element having two different states for storing different data in the resistance variable element, a transistor coupled to the variable resistance element, and a word line coupled to the transistor; grouping the memory cells into different groups based on distances from a write driver circuit; and supplying different levels of back bias voltages to different groups such that as a distance between the write driver circuit and a corresponding group is greater, a lower level of a back bias voltage is supplied to the corresponding group.

In some implementations, the supplying of the different levels of the supply back bias voltages may include: generating a negative voltage sufficiently lower than the different levels of the back bias voltages supplied to the different groups; and trimming the negative voltage to generating the different levels of the back bias voltages.

In some implementations, the method may further comprise: activating a word line to select a memory cell in which a data to be stored; and supplying write current to the selected memory cell in a first direction to store first data or in a second direction to store second data.

In some implementations, the method may further comprise: activating a word line to select a memory cell storing data to be discriminated; forming a current path such that a read current flows through the selected memory cell; and comparing the read current with a reference current to discriminate data stored in the selected memory cell.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

A semiconductor device in accordance with implementations of the present disclosure may include a resistance variable element. In the following descriptions, a resistance variable element may exhibit a resistance variable characteristic and may include a single layer or a multi-layer. For example, a resistance variable element may include substances used in an RRAM, a PRAM, an MRAM, an FRAM, and so forth, for example, a chalcogenide-based compound, a transition metal compound, a ferroelectric, a ferromagnetic, and so forth. However, other implementations are possible so long as a resistance variable element has a resistance variable characteristic switched between different resistant states according to voltages or currents applied to both ends thereof.

In some implementations, a resistance variable element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (PrCaMnO). Such a resistance variable element may exhibit a characteristic switched between different resistance states due to creation and extinction of current filaments through behavior of vacancies.

In other implementations, a resistance variable element may include a phase change substance. For example, the phase change substance may be a chalcogenide-based substance such as GST (Ge—Sb—Te). This resistance variable element may exhibit a characteristic switched between different resistant states by being stabilized in a crystalline state and an amorphous state by heat.

Further, a resistance variable element may include a structure in which a tunneling barrier layer is interposed between two ferromagnetic layers. The ferromagnetic layers may be formed using a substance such as NiFeCo and CoFe, and the tunneling barrier layer may be formed using a substance such as Al2O3. The resistance variable element may exhibit a characteristic switched between different resistance states according to magnetization directions of the ferromagnetic layers. For example, in the case where the magnetization directions of the two ferromagnetic layers are parallel to each other, the resistance variable element may be in a low resistant state, and, in the case where the magnetization directions of the two ferromagnetic layers are anti-parallel to each other, the resistance variable element may be in a high resistant state.

Figure 1:
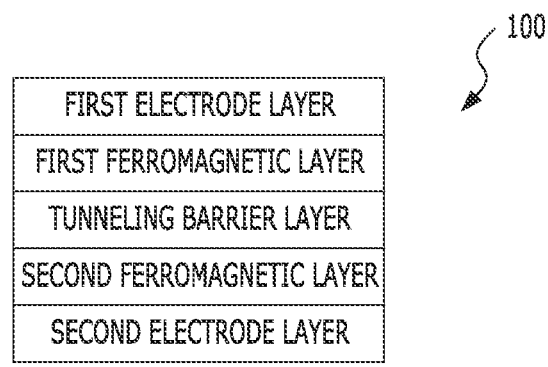
FIG. 1 is a configuration diagram showing an example of a magnetic tunnel junction (MTJ) element including a tunneling barrier layer is interposed between two ferromagnetic layers.

FIG. 1 is a diagram showing an example of a magnetic tunnel junction (MTJ) element as one of structures in which a tunneling barrier layer is interposed between two ferromagnetic layers.

Referring to FIG. 1, an MTJ element 100 includes a first electrode layer as a top electrode, a second electrode layer as a bottom electrode, a first ferromagnetic layer and a second ferromagnetic layer as a pair of ferromagnetic layers, and a tunneling barrier layer which is formed between the pair of ferromagnetic layers.

The first ferromagnetic layer is a free ferromagnetic layer of which magnetization direction may be changed according to a direction of current applied to the MTJ element 100, and the second ferromagnetic layer is a pinned ferromagnetic layer of which magnetization direction is pinned.

The MTJ element 100 is changed in its resistance value according to a direction of current, and records data "0" or "1".

Figure 2A:
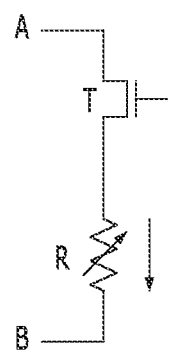
FIGS. 2A and 2B are diagrams explaining a principle of storing data in a resistance variable element.
Figure 2B:
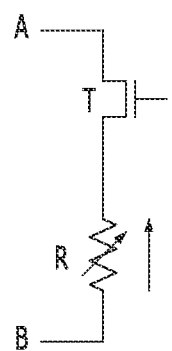

FIGS. 2A and 2B are views explaining a principle of storing data in a resistance variable element R. The resistance variable element R may be the MTJ element 100 described above with reference to FIG. 1.

FIG. 2A is a diagram explaining a principle of recording data with a low logic value in the resistance variable element R. In order to select the resistance variable element R in which data is to be stored, a word line WL coupled to the resistance variable element R is activated, and a transistor T is turned on. As current flows from one end A to the other end B (in the direction indicated by the arrow), that is, from the first electrode layer as a top electrode to the second electrode layer as a bottom electrode in the MTJ element 100 shown in FIG. 1, the magnetization direction of the first ferromagnetic layer as a free ferromagnetic layer and the magnetization direction of the second ferromagnetic layer as a pinned ferromagnetic layer become parallel to each other, and the resistance variable element R is in a low resistant state. When the resistance variable element R is in the low resistant state, it is defined that 'low' data is stored in the resistance variable element R.

FIG. 2B is a diagram explaining a principle of recording data with a high logic value in the resistance variable element R. In a similar manner, the word line WL coupled to the resistance variable element R is activated, and the transistor T is turned on. As current flows from the other end B to one end A (in the direction indicated by the arrow), that is, from the second electrode layer to the first electrode layer in the MTJ element 100 shown in FIG. 1, the magnetization direction of the first ferromagnetic layer and the magnetization direction of the second ferromagnetic layer become anti-parallel to each other, and the resistance variable element R is in a high resistant state. When the resistance variable element R is in the high resistant state, it is defined that 'high' data is stored in the resistance variable element R.

Each memory cell includes the resistance variable element R and the transistor T which are disposed in the form of an array including a plurality of columns and a plurality of rows.

A write driver circuit supplies a current to in a write operation. In this regard, although a memory cell positioned close to the write driver circuit may be supplied with a sufficient amount of current from the write driver circuit, a memory cell positioned remote from the write driver circuit may be difficult to be supplied with a sufficient amount of current from the write driver circuit, and due to this fact, the probability of a write operation not to be properly performed increases. Accordingly, a technology for supplying a uniform amount of current to memory cells disposed in the form of an array in a write operation is demanded.

Figure 3:
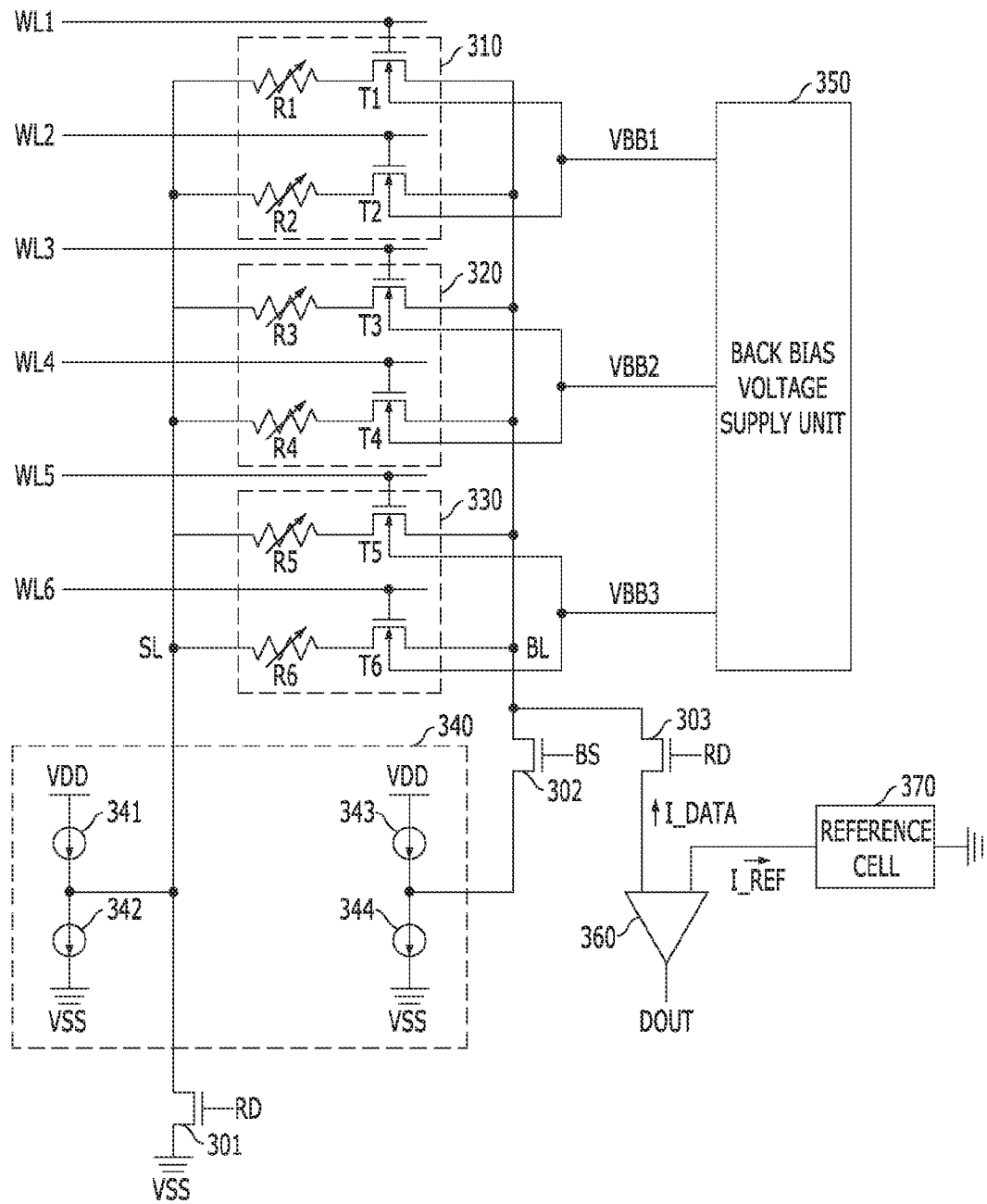
FIG. 3 is a configuration diagram of a semiconductor device in accordance with one implementation of the disclosed technology in this patent document.
Figure 4:
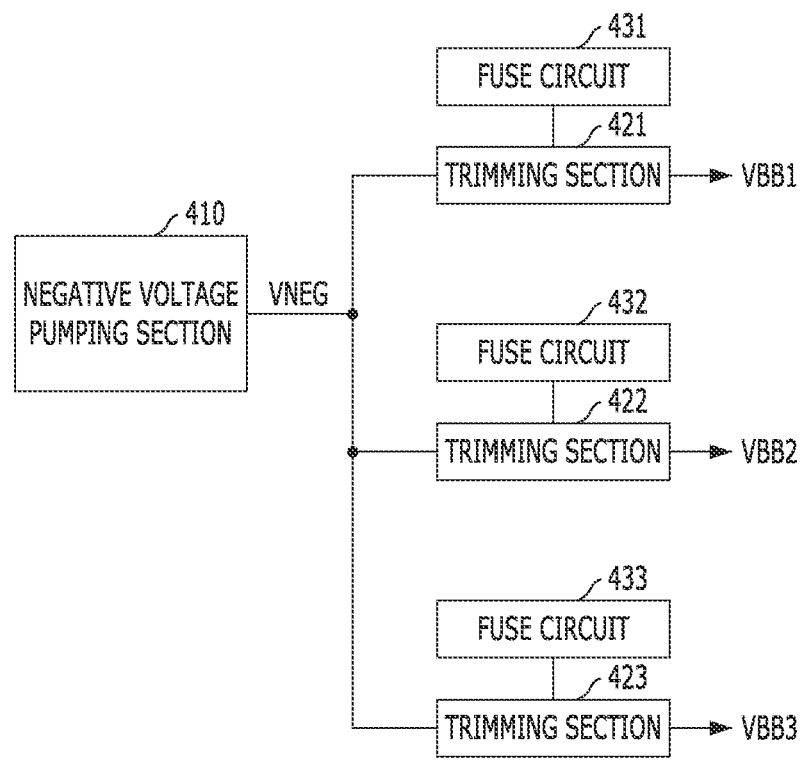
FIG. 4 is a configuration diagram of an exemplary implementation of the back bias voltage supply unit of FIG. 3.

FIGS. 3 and 4 show an exemplary implementation of a memory circuit or device having resistance variable elements as described above.

FIG. 3 is a configuration diagram of a memory circuit or device in accordance with one implementation of the disclosed technology in this patent document.

Referring to FIG. 3, a memory circuit includes a cell array including a plurality of regions 310, 320 and 330, a write driver circuit 340, a back bias voltage supply unit 350, a sense amplifier 360, a reference cell 370, a source line SL, a bit line BL, and word lines WL1 to WL6.

The source line SL and the bit line BL may be arranged parallel to each other, and memory cells are arranged between the source line SL and the bit line BL (six memory cells are shown in the drawing). The memory cells include resistance variable elements R1 to R6 and transistors T1 to T6, respectively. The transistors T1 to T6 are coupled in series to the corresponding resistance variable elements R1 to R6 between the source line SL and the bit line BL. Each of the resistance variable elements R1 to R6 has one resistance value between a high resistance value and a low resistance value according to the logic value of the data stored therein, and the transistors T1 to T6 are turned on and off in response to the corresponding word lines WL1 to WL6. The word lines WL1 to WL6 may be arranged in a direction perpendicular to the source line SL and the bit line BL.

The cell array includes a plurality of regions 310, 320 and 330. The regions 310, 320 and 330 may be defined based on distances from the write driver circuit 340. FIG. 3 shows an example in which the cell array includes three regions 310, 320 and 330, each region including two memory cells coupled in parallel, according to distances from the write driver circuit 340. The regions 310, 320 and 330 are provided with back bias voltages VBB1, VBB2 and VBB3, respectively, which have different levels from one another. As a distance from the write driver circuit 340 increases, a back bias voltage with a lower level is applied. Therefore, the back bias voltage VBB3 supplied to the region 330 which is the closest to the write driver circuit 340 has a level higher than the back bias voltage VBB2 supplied to the region 320, and the back bias voltage VBB1 supplied to the region 310 which is the remotest from the write driver circuit 340 has a level lower than the back bias voltage VBB2 supplied to the region 320.

The back bias voltages VBB1, VBB2 and VBB3 supplied to the regions 310, 320 and 330 are applied to the back bias terminals of the transistors T1 to T6. Each of the transistors T1 to T6 has a characteristic that it is turned on stronger (having less resistance) as a voltage applied to the corresponding back bias terminal decreases. Therefore, the transistors T1 and T2 of the region 310 are turned on better than the transistors T3 and T4 of the region 320, and the transistors T3 and T4 of the region 320 are turned on stronger than the transistors T5 and T6 of the region 330. As the distance between a memory cell and the write driver circuit 340 increases, the current supplied from the write driver circuit 340 may decrease due to the increase associated with the increased distance and thus, the memory cell positioned remotely from the write driver circuit may not be provided with a sufficient current. Such a disadvantage may be offset by providing different levels of back bias voltages to the regions 310, 320 and 330 to compensate for the variations in currents caused by the different positions of regions 310, 320 and 330. For example, although the memory cells in the region 310 are supplied with a smaller amount of write current than the memory cells in the region 330, since the transistors T1 and T2 of the memory cells in the region 310 are turned on stronger than the transistors T5 and T6 of the memory cells in the region 330, the same result may be obtained as the case when the same amount of current is supplied to the resistance variable elements R1, R2, R5 and R6 of the two regions 310 and 330.

The write driver circuit 340 supplies a write current to the source line SL and the bit line BL. In the case where data to be written is low data, the write driver circuit 340 supplies write current in a direction extending from the bit line BL to the source line SL. In this case, current sources 342 and 343 are activated, and current sources 341 and 344 are deactivated. In the case where data to record is high data, the write driver circuit 340 supplies write current in a direction extending from the source line SL to the bit line BL. In this case, the current sources 341 and 344 are activated, and the current sources 342 and 343 are deactivated.

The back bias voltage supply unit 350 is configured to generate the back bias voltages VBB1, VBB2 and VBB3 which have different levels, and supply the back bias voltages VBB1, VBB2 and VBB3 to the regions 310, 320 and 330 in the cell array. The back bias voltages VBB1, VBB2 and VBB3 are usually negative voltages lower than a ground voltage, and the back bias voltages VBB1, VBB2 and VBB3 may satisfy a relationship of VBB1<VBB2<VBB3. For example, VBB1=−0.8V, VBB2=−0.7V, and VBB3=−0.6V.

The sense amplifier 360 is configured to compare current I_DATA flowing through the bit line BL and reference current I_REF, and sense the data of a selected memory cell. In the case where the current I_DATA flowing through the bit line BL is greater than the reference current I_REF, the data of a selected memory cell is recognized as low. In the case where the current I_DATA flowing through the bit line BL is smaller than the reference current I_REF, the data of a selected memory cell is recognized as high. The reference current I_REF may be generated using the reference cell 370. The reference cell 370 has a resistance value between the low resistance value of the resistance variable element (i.e., when low data is stored) and the high resistance value of the resistance variable element (i.e., when high data is stored).

Hereinbelow, descriptions will be made for a read and write operations separately. It is assumed in the below that the memory cell including the resistance variable element R2 and the transistor T2 coupled to the word line WL2 is selected among the six memory cells.

(1) A Write Operation for Recording Low Data in the Selected Memory Cell

In a write operation, since a bit line select signal BS is activated and a read signal RD is deactivated, a transistor 302 is turned on and transistors 301 and 303 are turned off. Further, since the word line WL2 is activated and the remaining word lines WL1 and WL3 to WL6 are deactivated, the transistor T2 is turned on and the transistors T1 and T3 to T6 are turned off. Therefore, a current path is formed between the bit line BL and the source line SL through only the selected memory cell including the resistance variable element R2 and the transistor T2 among the six memory cells. Moreover, since the current sources 342 and 343 of the write driver circuit 340 are activated, write current flows in the direction from the bit line BL to the source line SL. Accordingly, the resistance variable element R2 becomes a low resistance state, that is, a state in which low data is stored therein. The selected memory cell including the resistance variable element R2 and the transistor T2 is positioned remotely from the write driver circuit 340 and thus, the selected memory cell may not be provided with a sufficient amount of write current. However, since the transistor T2 is strongly turned on by the low level of the back bias voltage VBB1, a sufficient amount of a current that allows the resistance variable element R2 to store low data therein can flow through the resistance variable element R2.

(2) A Write Operation for Recording High Data in the Selected Memory Cell

In a write operation, since the bit line select signal BS is activated and the read signal RD is deactivated, the transistor 302 is turned on and the transistors 301 and 303 are turned off. Further, since the word line WL2 is activated and the remaining word lines WL1 and WL3 to WL6 are deactivated, the transistor T2 is turned on and the transistors T1 and T3 to T6 are turned off. Therefore, a current path is formed between the bit line BL and the source line SL through only the selected memory cell including the resistance variable element R2 and the transistor T2 among the six memory cells. Moreover, since the current sources 341 and 344 of the write driver circuit 340 are activated, write current flows in the direction extending from the source line SL to the bit line BL. Accordingly, the resistance variable element R2 becomes a high resistance state, that is, a state in which high data is stored therein. Since the memory cell including the resistance variable element R2 and the transistor T2 is positioned remotely from the write driver circuit 340, the selected memory cell may not be provided with a sufficient amount of write current. However, since the transistor T2 is strongly turned on by the low level of the back bias voltage VBB1, a sufficient amount of current that allows the resistance variable element R2 to store high data therein can flow through the resistance variable element R2.

(3) A Read Operation for Reading the Data Stored in the Selected Memory Cell

In a read operation, since the read signal RD is activated and the bit line select signal BS is deactivated, the transistors 301 and 303 are turned on and the transistor 302 is turned off. Further, since the word line WL2 is activated and the remaining word lines WL1 and WL3 to WL6 are deactivated, the transistor T2 is turned on and the transistors T1 and T3 to T6 are turned off. Therefore, a current path is formed between the bit line BL and the source line SL through only the memory cell including the resistance variable element R2 and the transistor T2 among the six memory cells. In the case where the resistance variable element R2 has a high resistant state (that is, high data is stored in the resistance variable element R2), the amount of the current I_DATA flowing to the sense amplifier 360 through the bit line BL is smaller than the amount of the reference current I_REF. Accordingly, the sense amplifier 360 may sense that the data stored in the resistance variable element R2 is high. In the case where the resistance variable element R2 has a low resistant state (that is, low data is stored in the resistance variable element R2), the amount of the current I_DATA flowing to the sense amplifier 360 through the bit line BL is greater than the amount of the reference current I_REF. Accordingly, the sense amplifier 360 may sense that the data stored in the resistance variable element R2 is low.

Although it is shown in FIG. 3 that the cell array including regions 310, 320 and 330 is arranged in one column defined by a pair of bit line and source line and six rows with corresponding six word lines, it is to be noted as a matter of course that a cell array may be arranged in several tens to several hundreds of rows and columns. Also, it is appreciated that a cell array may include various number of regions if the cell array includes at least two regions that are located at different distances from a write driver circuit. Further, as the size of a cell array increases, effects achieved by dividing the cell array into regions and supplying different levels of back bias voltages according to distances from a write driver circuit may be ameliorated.

FIG. 4 is a configuration diagram of an exemplary implementation of the back bias voltage supply unit 350 of FIG. 3.

Referring to FIG. 4, the back bias voltage supply unit 350 may include a negative voltage pumping section 410, trimming sections 421, 422 and 423, and fuse circuits 431, 432 and 433.

The negative voltage pumping section 410 is configured to generate a negative voltage VNEG which has a level lower than a ground voltage, through a pumping operation. The negative voltage VNEG is generated sufficiently lower than the levels of the back bias voltages VBB1, VBB2 and VBB3. For example, when the levels of the back bias voltages VBB1, VBB2 and VBB3 are respectively −0.8V, −0.7V and −0.6V, the negative voltage VNEG is generated to have the level of −1.0V lower than these levels.

The trimming sections 421, 422 and 423 are configured to trim (for example, divide) the negative voltage VNEG and generate the back bias voltages VBB1, VBB2 and VBB3. The levels of target voltages to be generated by the trimming sections 421, 422 and 423 are stored in the fuse circuits 431, 432 and 433. For example, in the case where information on the target voltage is stored as −0.7V in the fuse circuit 432, the trimming section 422 may divide the negative voltage VNEG and generate the back bias voltage VBB2 with the level of −0.7V. Although the fuse circuits 431, 432 and 433 are exemplified as circuits for storing information on the levels of the back bias voltages VBB1, VBB2 and VBB3 which are to be generated by the trimming sections 421, 422 and 423, different types of circuits may be used for storing information instead of the fuse circuits 431, 432 and 433. The optimum target voltage levels of the back bias voltages VBB1, VBB2 and VBB3 to be stored in the fuse circuits 431, 432 and 433 may be found through testing read and write operations in the fabrication of a memory circuit.

As is apparent from the above descriptions, according to the implementation of the present disclosure, it is possible to always flow a constant amount of current regardless of positions of resistance variable elements while recording data in the resistance variable elements.

The above and other memory circuits or semiconductor devices based on the disclosed technology can be used in a range of devices or systems. FIGS. 5-9 provide some examples of devices or systems that can implement the memory circuits disclosed herein.

Figure 5:
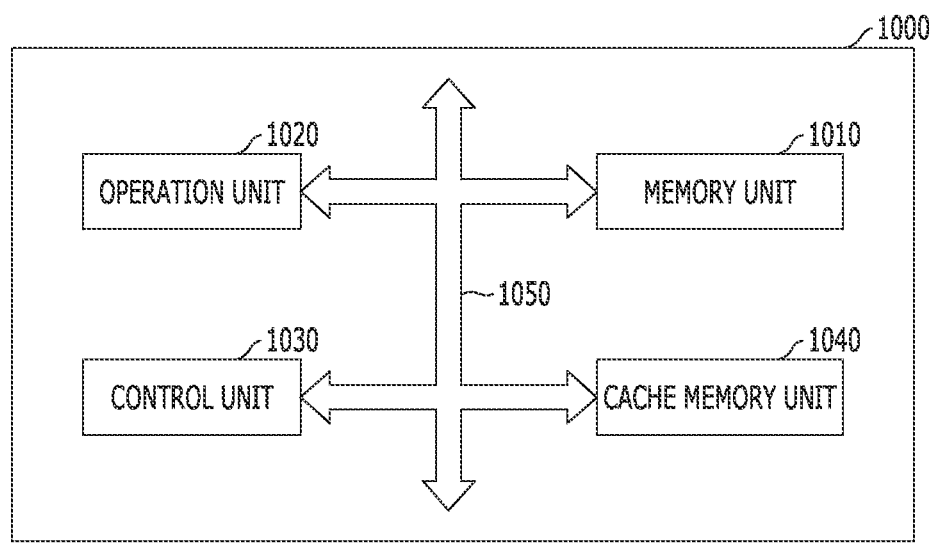
FIG. 5 shows an example of a configuration diagram of a microprocessor implementing memory circuitry based on the disclosed technology.

FIG. 5 shows an example of a configuration diagram of a microprocessor based on another implementation of the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a cell array divided into at least two regions each of which includes a plurality of memory cells each including a transistor and a resistance variable element, a write driver circuit configured to supply write current to a memory cell selected among memory cells in the cell array, and a back bias voltage supply unit configured to supply back bias voltages with different levels to the regions in the cell array. Since it is possible to always flow a constant amount of current during write operation, a write operation may be performed with stability. Through this, the memory unit 1010 may operate more precisely. Accordingly, the performance of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
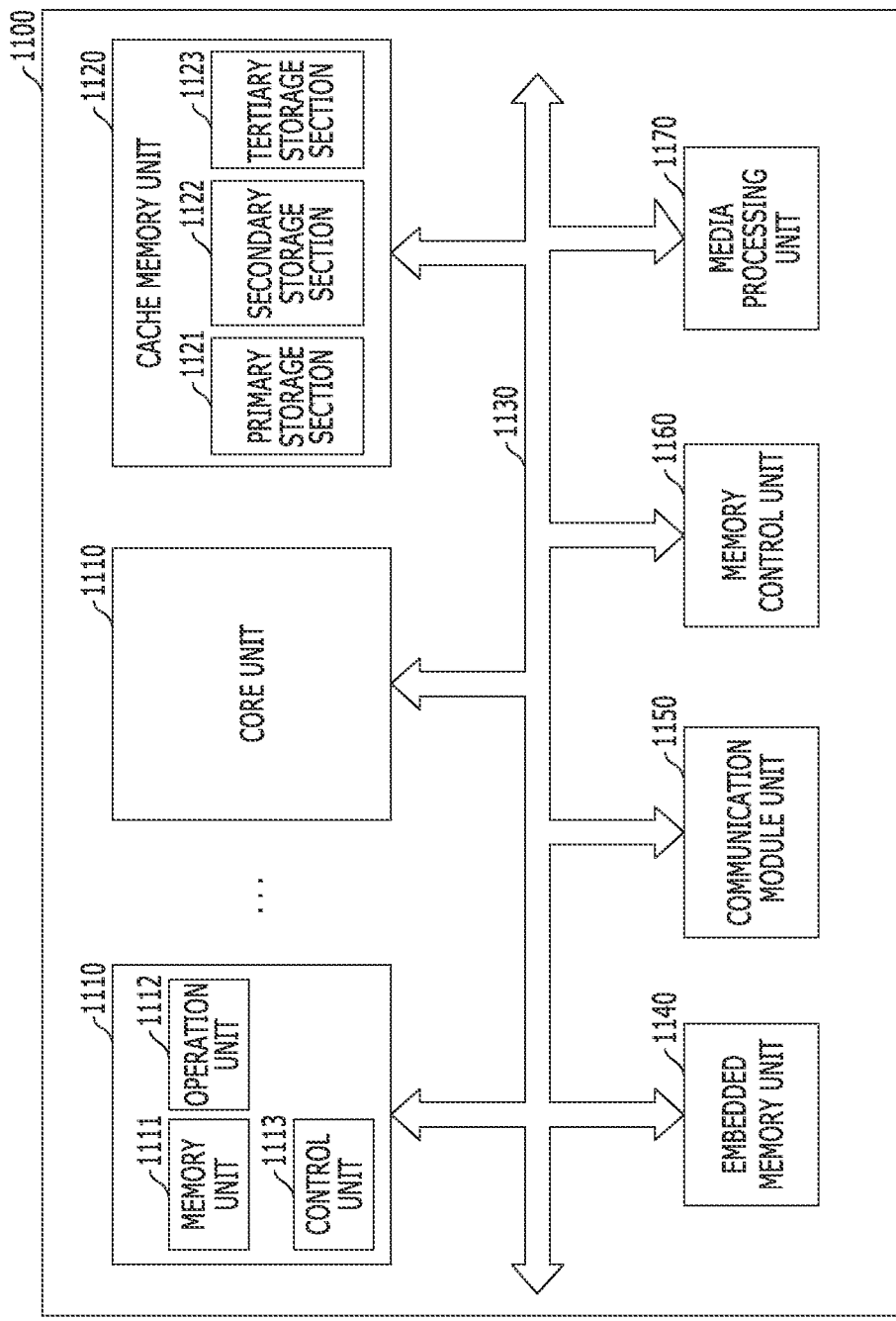
FIG. 6 shows an example of a configuration diagram of a processor implementing memory circuitry based on the disclosed technology.

FIG. 6 is a configuration diagram of a processor based on another implementation of the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a cell array divided into at least two regions each of which includes a plurality of memory cells each including a transistor and a resistance variable element, a write driver circuit configured to supply write current to a memory cell selected among memory cells in the cell array, and a back bias voltage supply unit configured to supply back bias voltages with different levels to the regions in the cell array. Since it is possible to always flow a constant amount of current during write operation, a write operation may be performed with stability. Through this, the cache memory unit 1120 may operate more precisely. Accordingly, the performance of the core unit 1110 may be improved.

Although it was shown in FIG. 6 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
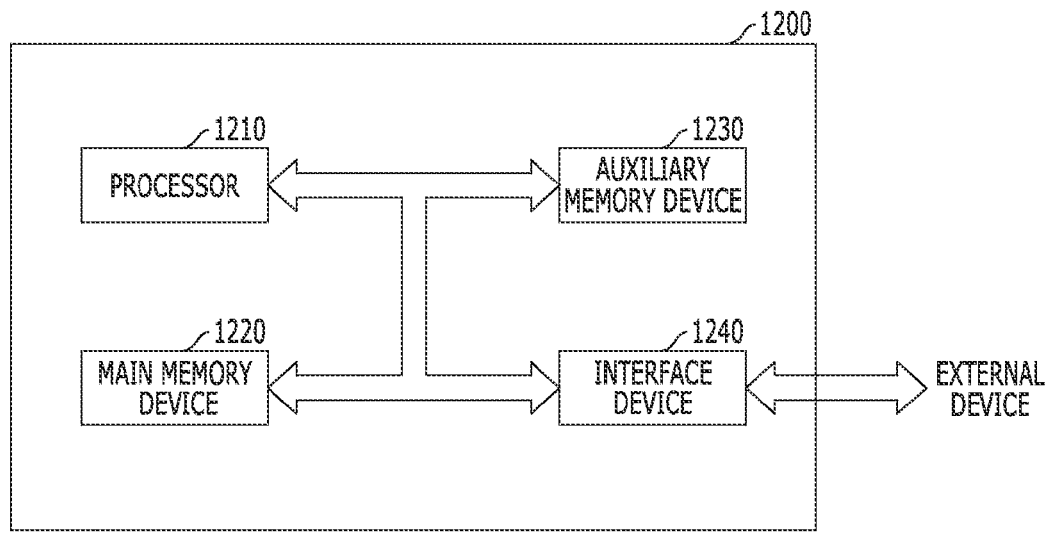
FIG. 7 shows an example of a configuration diagram of a system implementing memory circuitry based on the disclosed technology.

FIG. 7 is a configuration diagram of a system based on another implementation of the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a cell array divided into at least two regions each of which includes a plurality of memory cells each including a transistor and a resistance variable element, a write driver circuit configured to supply write current to a memory cell selected among memory cells in the cell array, and a back bias voltage supply unit configured to supply back bias voltages with different levels to the regions in the cell array. Since it is possible to always flow a constant amount of current during write operation, a write operation may be performed with stability. Through this, the main memory device 1220 may operate more precisely. Accordingly, the performance of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a cell array divided into at least two regions each of which includes a plurality of memory cells each including a transistor and a resistance variable element, a write driver circuit configured to supply write current to a memory cell selected among memory cells in the cell array, and a back bias voltage supply unit configured to supply back bias voltages with different levels to the regions in the cell array. Since it is possible to always flow constant amount of current during write operation, a write operation may be performed with stability. Through this, the auxiliary memory device 1230 may operate more precisely. Accordingly, the performance of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
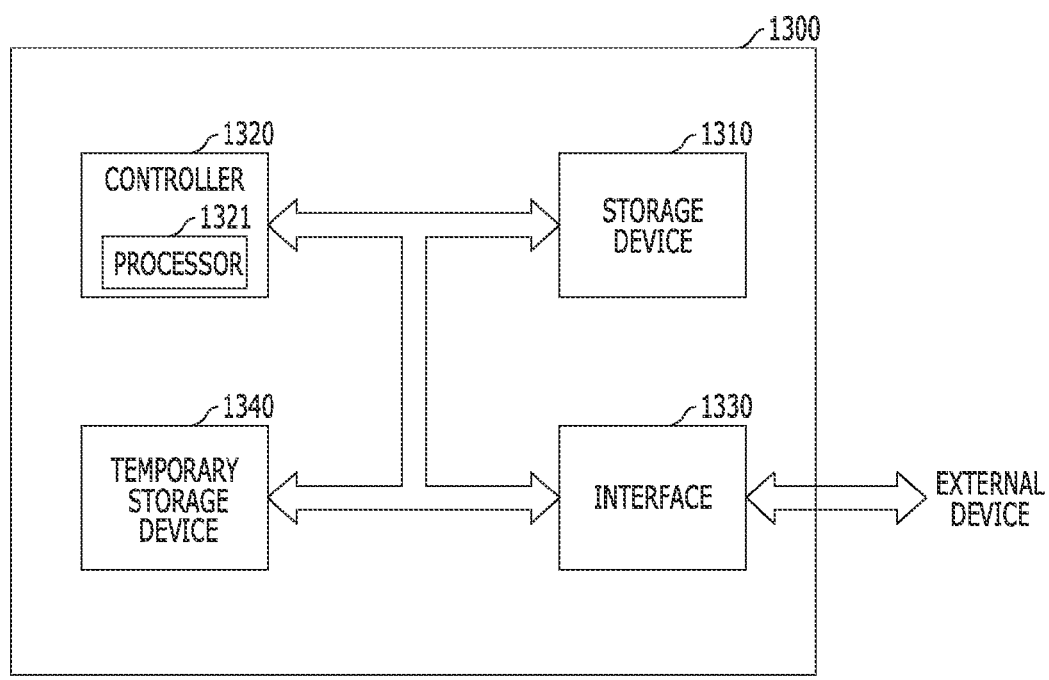
FIG. 8 shows an example of a configuration diagram of a data storage system implementing memory circuitry based on the disclosed technology.

FIG. 8 is a configuration diagram of a data storage system based on another implementation of the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a cell array divided into at least two regions each of which includes a plurality of memory cells each including a transistor and a resistance variable element, a write driver circuit configured to supply write current to a memory cell selected among memory cells in the cell array, and a back bias voltage supply unit configured to supply back bias voltages with different levels to the regions in the cell array. Since it is possible to always flow a constant amount of current during write operation, a write operation may be performed with stability. Through this, the storage device 1310 or the temporary storage device 1340 may operate more precisely. Accordingly, the data storage system 1300 may be improved in terms of portability and performance.

Figure 9:
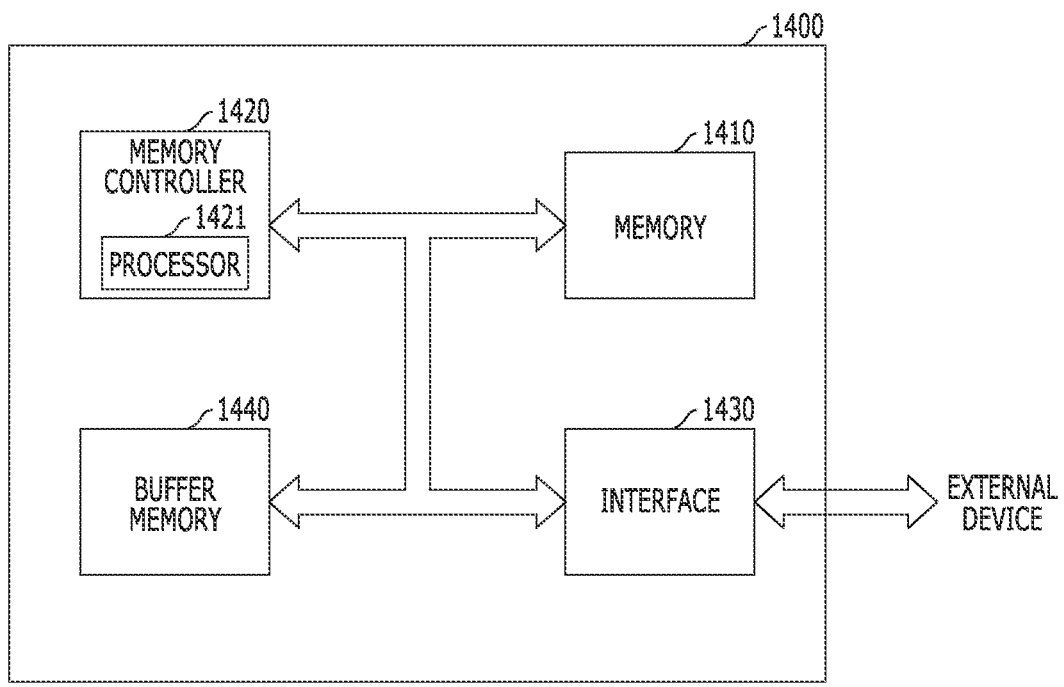
FIG. 9 shows an example of a configuration diagram of a memory system implementing memory circuitry based on the disclosed technology.

FIG. 9 is a configuration diagram of a memory system based on another implementation of the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a plurality of resistance variable elements, a plurality of read voltage application terminals configured to supply different levels of read voltages to respective one ends of the plurality of resistance variable elements, and an analog-to-digital conversion unit configured to generate multi-bit digital data corresponding to a total current which is acquired by summing currents flowing through the plurality of resistance variable elements. Since the data of a plurality of resistance variable elements may be simultaneously read using one sense amplifier circuit, the area of a circuit may be reduced and a read operation may be performed at a high speed. Through this, the size of the memory 1410 may be reduced and the operating speed of the memory 1410 may be improved. Accordingly, the size of the memory system 1400 may be reduced and the memory system may be improved in terms of portability and performance.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a cell array divided into at least two regions each of which includes a plurality of memory cells each including a transistor and a resistance variable element, a write driver circuit configured to supply write current to a memory cell selected among memory cells in the cell array, and a back bias voltage supply unit configured to supply back bias voltages with different levels to the regions in the cell array. Since it is possible to always flow a constant amount of current during write operation, a write operation may be performed with stability. Through this, the buffer memory 1440 may operate more precisely. Accordingly, the performance of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
    a cell array including different cell regions each of which includes a plurality of memory cells, each memory cell including a transistor and a resistance variable element;
    a write driver circuit coupled to the cell array to supply a write current for storing data in a memory cell selected among the plurality of memory cells; and
    a back bias voltage supply unit coupled to the different cell regions of the cell array and configured to supply back bias voltages with different levels to the respective cell regions,
    wherein the levels of the back bias voltages to be supplied to the respective regions are determined based on distances between the write driver circuit and the respective cell regions.

2. The electronic device according to claim 1, wherein the back bias voltage decreases as a distance of a corresponding cell region from the write driver circuit increases.

3. The electronic device according to claim 1, wherein the back bias voltage supply unit supplies the back bias voltages with different levels to transistors in the different cell regions.

4. The electronic device according to claim 1, wherein the resistance variable element includes at least one of a metal oxide, a phase change substance.

5. The electronic device according to claim 1, wherein the back bias voltage supply unit comprises:
    a negative voltage pumping section configured to generate a negative voltage; and
    at least two trimming sections configured to trim the negative voltages to different levels and supply the back bias voltages with different levels.

6. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
        wherein the semiconductor memory unit that includes the resistance variable element is part of the cache memory unit in the processor.

7. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between the processor, the auxiliary memory device or the main memory device and the outside,
    wherein the semiconductor memory unit that includes the resistance variable element is part of the auxiliary memory device or the main memory device in the processing system.

8. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory unit that includes the resistance variable element is part of the storage device or the temporary storage device in the data storage system.

9. An electronic device including a semiconductor memory, the semiconductor memory comprising:
    a bit line and a source line arranged in a first direction;
    a plurality of memory cells each including a resistance variable element and a transistor which are coupled in series between the bit line and the source line;
    a plurality of word lines arranged in a second direction perpendicular to the first direction, and connected to the respective transistors of the plurality of memory cells to activate a corresponding transistor of a selected memory cell among the plurality of memory cells;
    a write driver circuit configured to supply write current to the selected memory cell; and
    a back bias voltage supply unit configured to supply back bias voltages with different levels to the plurality of memory cells such that a back bias voltage with a lower level is supplied to a memory cell that is apart by a greater distance from the write driver circuit.

10. The electronic device according to claim 9, wherein the write driver circuit supplies write current in different directions to store data with different logic values in a resistance variable element of the selected memory cell.

11. The electronic device according to claim 9, wherein the resistance variable element includes at least one of a metal oxide and a phase change substance.

12. The electronic device according to claim 9, further comprising a microprocessor which includes:
 a control unit that is configured to receive a signal including a command from an outside of the microprocessor, and performs extracting, decoding of the command, or controlling input or output of a signal of microprocessor;
 an operation unit configured to perform an operation based on a result that the control unit decodes the command; and
 a memory unit configured to store data for performing the operation, data corresponding to a result of performing the operation, or an address of data for which the operation is performed,
 wherein the semiconductor memory unit that includes the resistance variable element is part of the memory unit in the microprocessor.

13. The electronic device according to claim 9, further comprising a processor which includes:
 a core unit configured to perform, based on a command inputted from an outside of the processor, an operation corresponding to the command, by using data;
 a cache memory unit configured to store data for performing the operation, data corresponding to a result of performing the operation, or an address of data for which the operation is performed; and
 a bus interface connected between the core unit and the cache memory unit, and configured to transmit data between the core unit and the cache memory unit,
 wherein the semiconductor memory unit that includes the resistance variable element is part of the cache memory unit in the processor.

14. The electronic device according to claim 9, further comprising a processing system which includes:
 a processor configured to decode a command received by the processor and control an operation for information based on a result of decoding the command;
 an auxiliary memory device configured to store a program for decoding the command and the information;
 a main memory device configured to call and store the program and the information from the auxiliary memory device such that the processor can perform the operation using the program and the information when executing the program; and
 an interface device configured to perform communication between the processor, the auxiliary memory device or the main memory device and the outside,
 wherein the semiconductor memory unit that includes the resistance variable element is part of the auxiliary memory device or the main memory device in the processing system.

15. The electronic device according to claim 9, further comprising a data storage system which includes:
 a storage device configured to store data and conserve stored data regardless of power supply;
 a controller configured to control input and output of data to and from the storage device according to a command inputted form an outside;
 a temporary storage device configured to temporarily store data exchanged between the storage device and the outside; and
 an interface configured to perform communication between at least one of the storage device, the controller and the temporary storage device and the outside,
 wherein the semiconductor memory unit that includes the resistance variable element is part of the storage device or the temporary storage device in the data storage system.

16. A method for operating an electronic device including a power supply device, comprising:
 providing memory cells arranged between a source line and a bit line, each memory cell including a resistance variable element having two different states for storing different data in the resistance variable element, a transistor coupled to the variable resistance element, and a word line coupled to the transistor;
 grouping the memory cells into different groups based on distances from a write driver circuit; and
 supplying different levels of back bias voltages to different groups such that as a distance between the write driver circuit and a corresponding group is greater, a lower level of a back bias voltage is supplied to the corresponding group.

17. The method of claim 16, wherein the supplying of the different levels of the supply back bias voltages includes:
 generating a negative voltage sufficiently lower than the different levels of the back bias voltages supplied to the different groups; and
 trimming the negative voltage to generating the different levels of the back bias voltages.

18. The method of claim 16, further comprising:
 activating a word line to select a memory cell in which a data to be stored; and
 supplying write current to the selected memory cell in a first direction to store first data or in a second direction to store second data.

19. The method of claim 16, further comprising:
 activating a word line to select a memory cell storing data to be discriminated;
 forming a current path such that a read current flows through the selected memory cell; and
 comparing the read current with a reference current to discriminate data stored in the selected memory cell.

* * * * *